United States Patent [19]

Rosencher et al.

[11] Patent Number: 5,228,777
[45] Date of Patent: Jul. 20, 1993

[54] QUANTUM-WELL ELECTRONIC BOLOMETER AND APPLICATION TO A RADIATION DETECTOR

[75] Inventors: Emmanuel Rosencher, Bagneux; Philippe Bois, Cesson, both of France

[73] Assignee: Thomson-CSF, Puteaux, France

[21] Appl. No.: 788,354

[22] Filed: Nov. 6, 1991

[30] Foreign Application Priority Data

Nov. 29, 1990 [FR] France .................. 90 14924

[51] Int. Cl.[5] ................................. G01K 17/20
[52] U.S. Cl. ............................ 374/32; 250/370.14; 257/185; 257/198
[58] Field of Search ........................ 374/32, 178; 250/370.01, 370.14; 357/4, 28, 29, 30, 16

[56] References Cited

U.S. PATENT DOCUMENTS

| | | | |
|---|---|---|---|
| 2,622,116 | 12/1952 | Maize | 357/28 |
| 3,863,070 | 1/1975 | Wheeler et al. | 250/370.14 |
| 4,546,373 | 10/1985 | Todd et al. | 357/28 |
| 4,590,507 | 5/1986 | Capasso et al. | 357/28 |
| 4,745,452 | 5/1988 | Sollner | 357/16 |
| 5,105,248 | 4/1992 | Burke et al. | 357/16 |

OTHER PUBLICATIONS

R. Heinrich, et al.: "Negative Infrared Photoconductivity in Narrow GaAs/AIGaAs Multiple Quantum Well Structures", Sep. 6, 1989, pp. 465-467.

Primary Examiner—Thomas B. Will
Assistant Examiner—G. Bradley Bennett
Attorney, Agent, or Firm—Oblon, Spivak, McClelland, Maier & Neustadt

[57] ABSTRACT

An electronic bolometer comprises at least a quantum well between two barrier layers. It has an input side parallel to the quantum-well layer and receiving a beam at a quasi-normal incidence angle. Two electrodes disposed perpendicularly to the quantum-well layers allow to measure a change in the resistivity of said quantum well.

15 Claims, 5 Drawing Sheets

QUANTUM-WELL ELECTRONIC BOLOMETER AND APPLICATION TO A RADIATION DETECTOR

BACKGROUND OF THE INVENTION

The present invention relates to a quantum-well electronic bolometer and its application to a detector of electromagnetic waves, in particular to a quantum-well semiconductor wave detector. This bolometer operates in the same manner as a hot-electron bolometer which allows, in contrast with known devices using quantum wells, to detect waves at normal incidence angles.

For example, the article of B. F. Levine et al published in Applied Physics Letters No 53, page 296, (1988), describes a quantum-well photoconductor including, as shown in FIG. 1, a stack of quantum wells each comprised of a layer of gallium arsenide (GaAs) (such as layer 1) flanked by two layers of aluminum-doped gallium arsenide (AlGaAs) (such as the layers 2 and 3). Electrodes 4 and 5 are provided at the upper part and at the lower part of the stack of layers. In such a device, the electrons are stored at their quantum energy level in the GaAs quantum well. Under an illumination, these electrons are excited into the conduction band of the potential barrier (AlGaAs) and are collected in the ohmic contacts (electrodes 4 and 5) located on either side of the quantum-well stack.

This type of detector has two disadvantages:

1. In the photoconductive mode, current is independent of the number of wells with constant electric field. A single well can detect the light, the structure biasing itself again to keep this current in the detector. This comes from the fact that, in this detector, the flux of photons is parallel to the flux of electrons.

2. As the motion of the electrons is quantized only in the direction of growth, only the internal electromagnetic field component normal to the quantum wells is detected. Thus, this device does not detect the incident waves normal to the surface, which makes their integration in two-dimensional systems very difficult, as described in the published documents:

K. W Goosen and S. A. Lyon, Applied Physics Letters, 53, 1027 (1988);

G. Hasnam, B. F. Levine, C. G. Bethea, R. A. Logan, J. Walker and R. J. Molik, Applied Physics Letters, 54, 2515 (1989).

The first disadvantage has found a solution in the patent application No. 90 06932 filed on Jun. 5, 1990 (E. Rosencher and B. Vinter) by adopting a geometry with transverse ohmic contacts. The device described in that patent application includes at least a first quantum well and a second, non-doped, quantum well, a transfer of electrons from the first well to the second well being possible under the action of an incident radiation propagating slantwise with respect to the plane of the quantum wells. The detector includes in addition ohmic contacts located laterally relative to the two quantum wells.

The second disadvantage is eliminated by the present invention. The basic idea of the present invention is to use a physical phenomenon which is not sensitive to the polarization of light: the hot-electron bolometry.

SUMMARY OF THE INVENTION

The present invention relates accordingly to a quantum-well electronic bolometer, comprising:

a stack of semiconductor layers forming at least a quantum well including at least a first allowed level and having an input side parallel to said layers intended to receive an illuminating beam at an angle of incidence relative to the normal between 0° and 80°;

means for increasing the populations of charge carriers (electrons or holes) of the first allowed level;

at least two electrodes located on two opposite lateral portions of the stack of layers.

The present invention also relates to a semiconductor radiation detector, including a bolometer intended to be illuminated by a radiation to be dectected at an angle of incidence close to the normal incidence angle.

BRIEF DESCRIPTION OF THE DRAWINGS

Other objects, features and advantages of the present invention will become apparent from the following detailed description of a preferred embodiment given as a non-limitative example with reference to the accompanying drawings, in which.

DESCRIPTION OF THE PREFERRED EMBODIMENT

Figure 1:
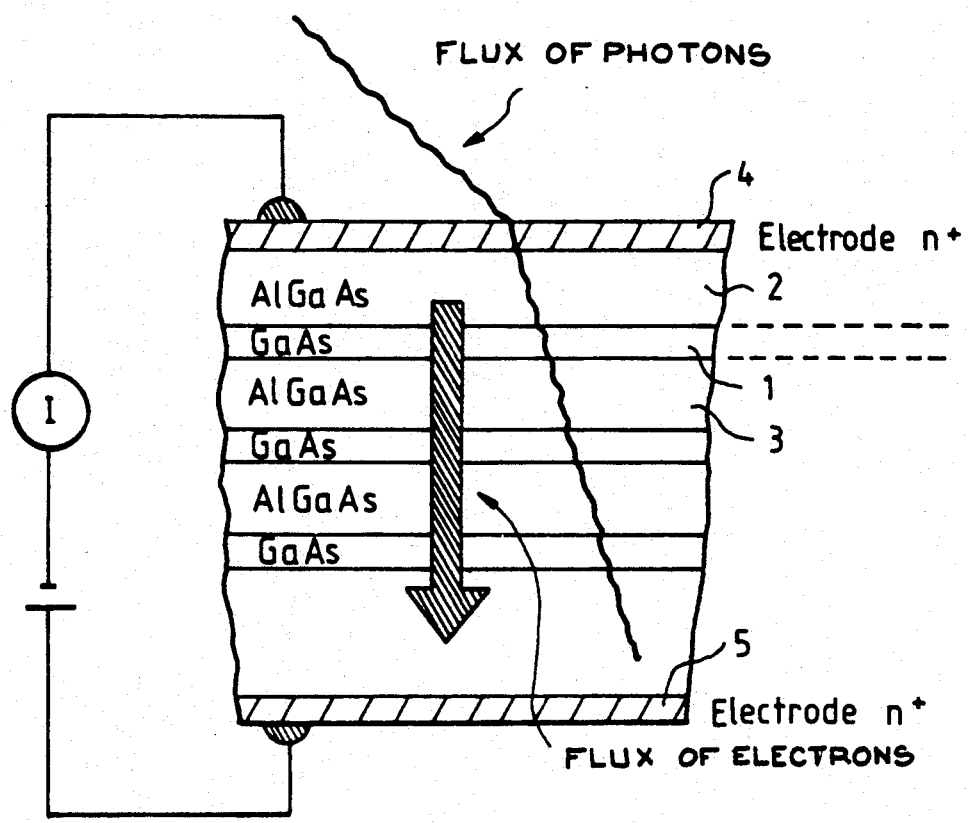
FIG. 1 shows a known device already described above.
Figure 2A:
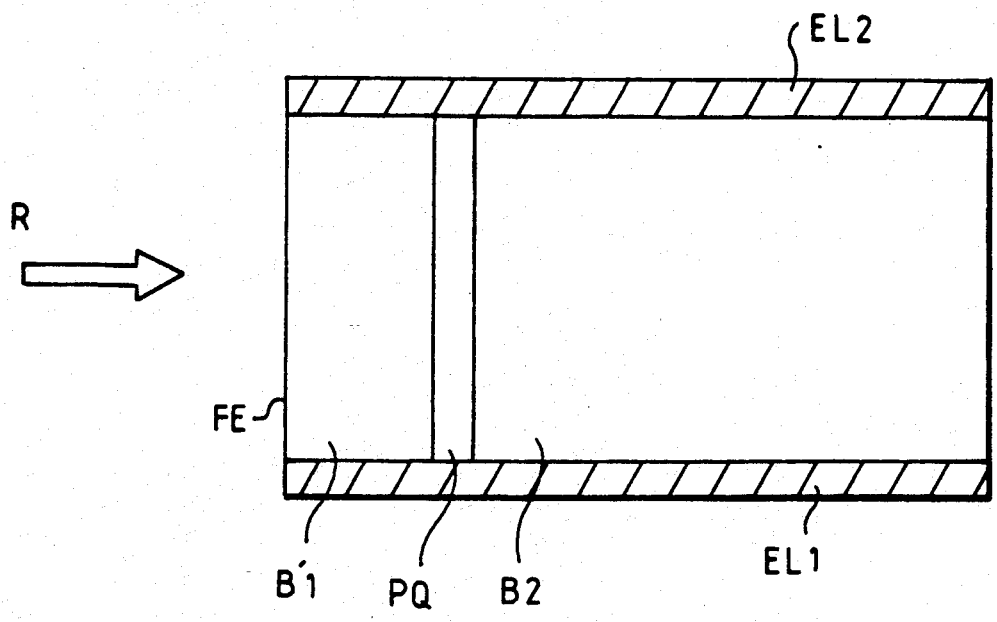
FIGS. 2a and 2b are simplified schematic diagrams of the device of the invention.

The device of the present invention shown in a schematic manner in FIG. 2a includes a stack of layers B1, PQ, B2. The layer PQ is made of a semiconducting material populated with carriers and forms a quantum well. The layers B1 and B2 form the barriers of the quantum well. Electrodes EL1, EL2 are disposed on two opposite edges of the device.

Figure 2B:
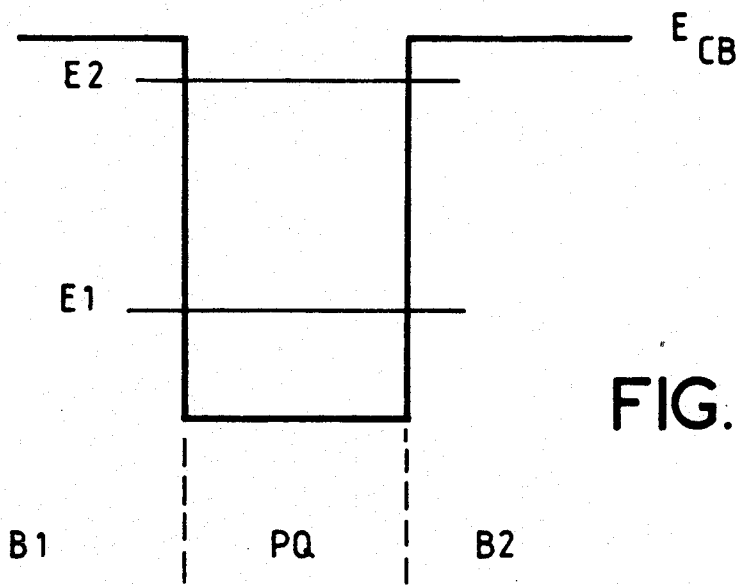

Such a structure exhibits a conduction band profile such as that shown in FIG. 2b. The dimensioning of the wells is such that the difference between the two energy levels E2-E1, or $E_{CB}$-E1 corresponds to the energy of the electromagnetic wave to be detected. Of course, this structure can be implemented with electrons as well as with holes, denoted by the term "carriers" in the following paragraphs.

The bolometric phenomenon is based on the change in conductivity of the carriers as a function of their electron temperature, that is their energy in their excited state with respect to their ground state. In darkness, this electron temperature depends on the applied electric field E. The conductivity $\sigma$ of the quantum wells in darkness is then given by:

$$\sigma(Te) = \sigma(E) = \sigma_0(1 + \beta E^2) \quad (1)$$

where $\sigma_0$ is the low-field conductivity, and $\beta$ is the non-linearity coefficient.

The optical power absorbed by the carriers of the subband (Drude effect) is converted into an electron temperature $\Delta Te$. In other words, the electron gas is heated up, causing a photoconductivity $\Delta\sigma$ (equation 1). SH. M. Koghan (see Soviet Physics-Solid State, 4, 1386 (1963)) has shown that in solid InSb materials, the V/W response associated with this bolometric effect $\Delta V/P_{absorbed}$ is given by:

$$R = \eta \frac{1}{S\sigma} \times \frac{\beta E}{1 + 2\beta E^2} \quad (5)$$

where $\eta$ is the percentage of absorbed energy and S is the area of the illuminated surface. In the case of quantum wells, quantization of the energy of the carriers leads to a resonant increase of the absorption of light. As can be seen, the quantum-well energy levels and materials are symmetric about the center of the quantum well.

Figure 3A:
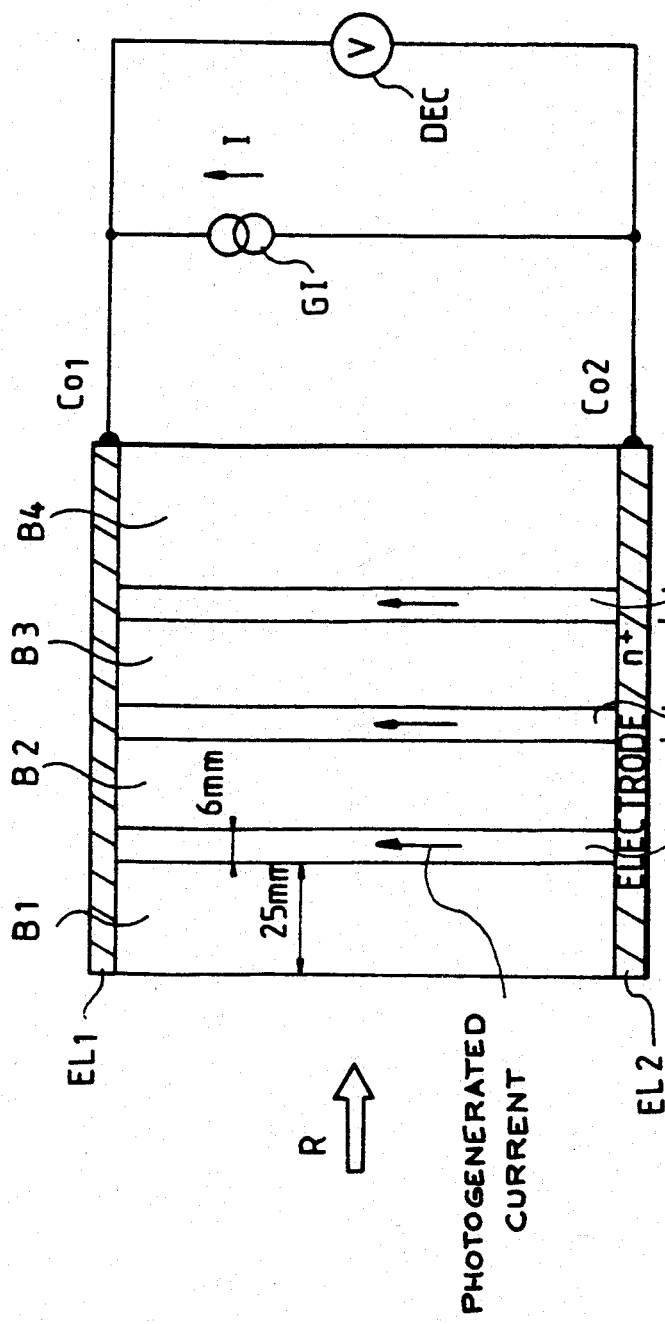
FIGS. 3a and 3b are detailed schematic diagrams of the operation of the device of the invention.

FIG. 3a shows a practical exemplary embodiment of the present invention. It is formed by a stack of:

quantum wells PQ1, PQ2, PQ3 made of GaAs doped at $5 \times 10^{11}$ cm$^{-2}$ with a thickness of 6 nanometers;

potential barriers B1, B2, B3, B4, . . . flanking the potential wells, and having a thickness of 25 nm, made of $Al_{0.24}$, $Ga_{0.76}$, As.

The assembly is epitaxially grown by any known means on a substrate made of semi-insulating GaAs. The thicknesses and the compositions of the layers are computed so as to obtain a resonant transition at 10.6 microns.

Figure 3B:
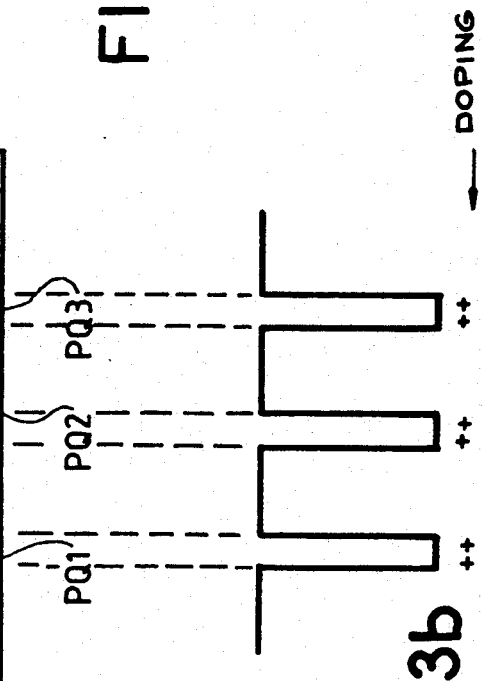

Referring to FIG. 3b, the potential profile of the conduction band of this structure is shown, but one could have shown the potential profile of the valence band instead.

What regards the detector proper, lateral dimensions of $100 \times 100$ microns, for example, will be suitable. The lateral ohmic contacts can be formed by diffusion of indium, for example. What regards the detection of the current, a current generator G1 can be connected to the terminal EL1 and EL3 of the device, and the potential change measured by a synchronous detector DEC or any other electronic arrangement known in the art.

Figure 4A:
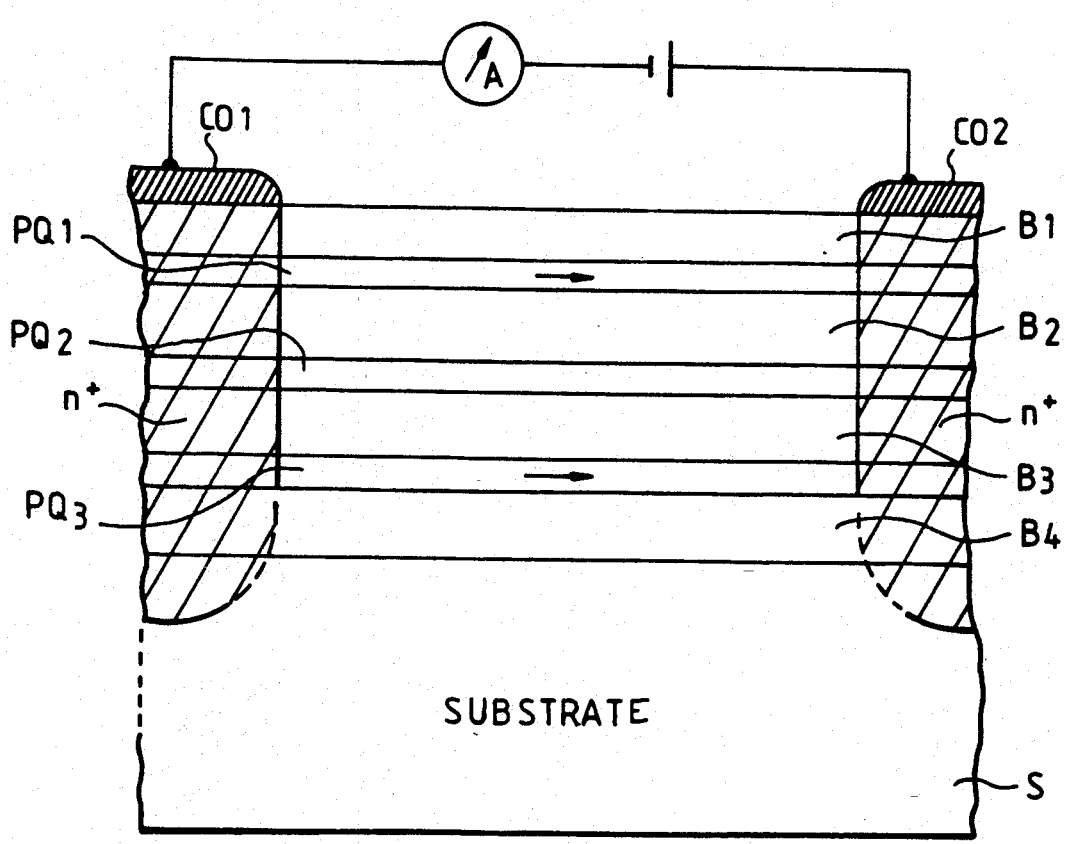
FIGS. 4a and 4b show a detailed exemplary embodiment of the device of the invention.
Figure 4B:
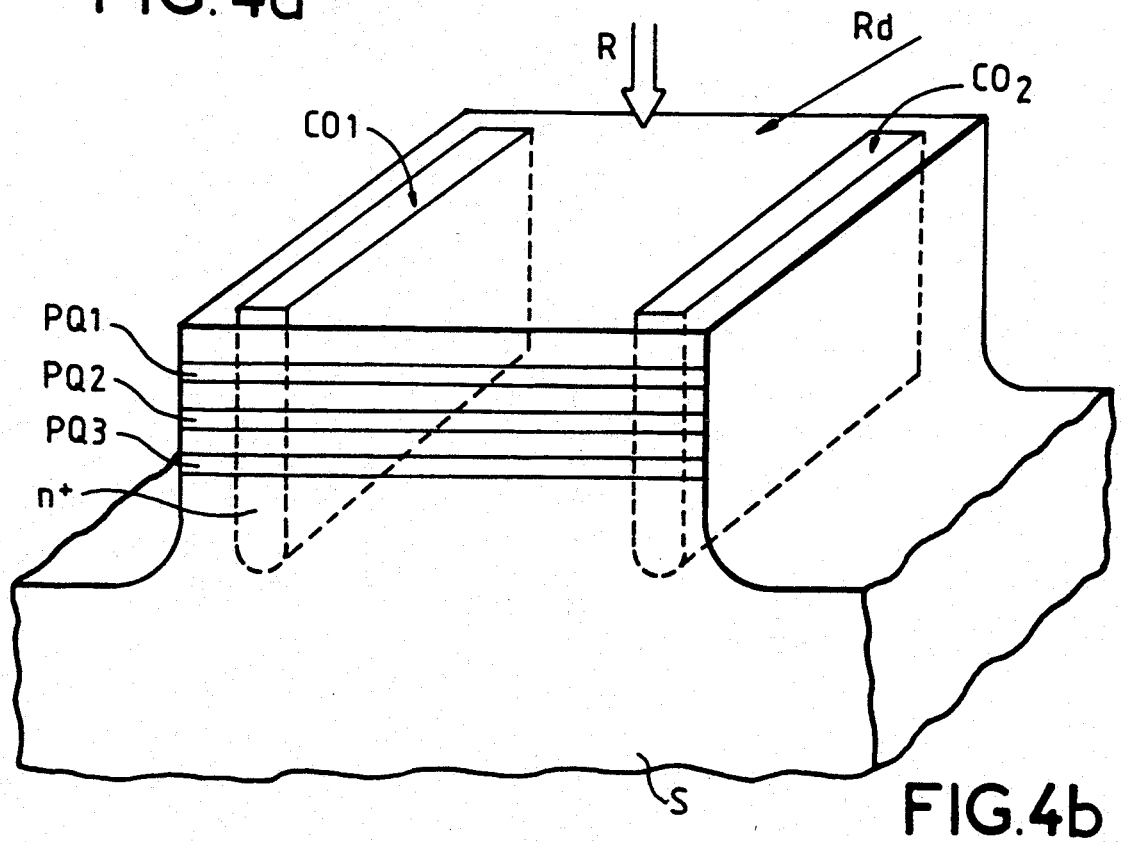

With reference to FIGS. 4a and 4b, an exemplary embodiment of the device of the invention will be described in detail.

The device comprises a semi-insulating GaAs substrate, alternate layers forming quantum wells PQ1, PQ2, PQ3, and barrier layers B1 through B4.

In these layers, diffusions or implantations of the n+ type are performed so as to obtain ohmic contacts with connections CO1 and CO2.

FIG. 4b is a perspective view of the structure of FIG. 4a.

The various layers of the device may be made of GaAs and AlGaAs, as this has been described above.

Figure 5:
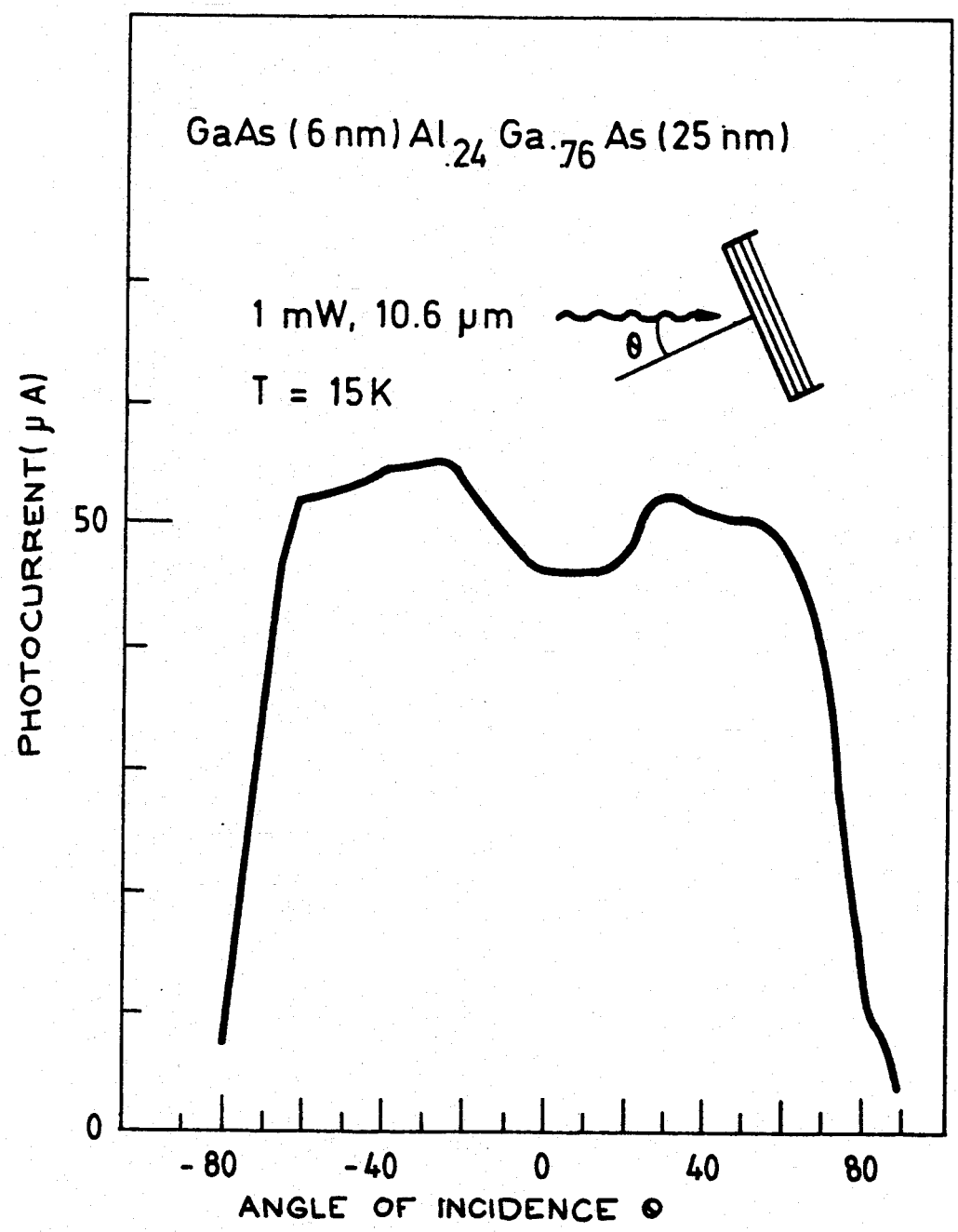
FIG. 5 illustrates the photoresponse of such a detector according to the present invention.

FIG. 5 illustrates the results of functional tests performed on a structure according to the invention. This is the response of a detector at 15K under a laser illumination of 1 mW at a 10.6-microns wavelength as a function of the incidence angle $\theta$. It can be seen that the component detects satisfactorily at a normal incidence angle, in contrast with the known components, with a response of 0.05 A/W at 15K. The photocurrent magnitude is relatively constant anywhere within an incident angle of 60° relative to a normal to the planes of the quantum-well layers. Within an angle of incidence of 60°, the largest photocurrent magnitude is no more than 150% of the smallest photocurrent magnitude.

It should be noted that, in the foregoing, the carrier population increase, for example in electrons, of the quantum well is achieved through direct doping of the well, or modulated doping of the barriers. According to the present invention, it is also provided that this electron population increase is obtained by means of a radiation Rd shown in FIG. 4a (while the radiation to be detected is denoted by R). The characteristic of this radiation Rd must be such that its wavelength corresponds to an energy higher than the confinement energy of the quantum well, i.e., higher than $Eg + E1 + Ehh_1$, where:

Eg is the band gap of the semiconductor material which forms the quantum well layer;

E1 is the first electron quantized level of the quantum well;

$Ehh_1$ is the first hole quantized level of the quantum well.

In the exemplary embodiments shown in FIGS. 3a and 3b, the detection of a beam with a single wavelength is considered. However, the structure of the invention is applicable to the detection of several wavelengths. To this end, quantum wells PQ1, PQ2, PQ3 with different characteristics are provided. In particular, wells with different widths can be provided.

Furthermore, the device according to the present invention can be implemented in the form of a linear array or a two-dimensional array through formation of electrodes in a single plate. Each element of the linear array or of the two-dimensional array can be read separately. The operation of the device of the invention at normal incidence angles allows integration and the operation in two-dimensional form.

Of course, the foregoing description is given only as a non-limitative example. In particular, the examples of numerical values and of materials (for example arsenic and gallium) have been given only to illustrate the description.

What is claimed is:

1. A quantum-well electronic bolometer for detecting radiation over a large solid angle, comprising:

a stack of semiconductor layers forming at least one quantum well having at least a first allowed energy level, and comprising a radiation input surface for receiving said radiation, wherein said input surface is parallel to said layers;

means for increasing the density of the charge carrier (electrons or holes) population of the first allowed energy level;

at least two electrodes located on two opposite lateral portions of said stack of layers; and means for generating a photocurrent across said electrodes in response to radiation traversing said radiation input surface, wherein the largest magnitude of said photocurrent response for radiation whose angle of incidence into said radiation input surface is less than sixty degrees is not more than 150% of the smallest magnitude of photocurrent response in the same incident angle range.

2. A bolometer according to claim 1, wherein said bolometer comprises means for accepting radiation incident at an angle of incidence that is close to 0 degrees relative to a normal of said input surface direction.

3. A bolometer according to claim 1, wherein said means for increasing the charge carrier population comprises direct doping of the quantum-well layer and/or a modulated doping.

4. A bolometer according to claim 1, wherein said means for increasing the electron population comprises a light beam with a wavelength corresponding to an energy higher than the confinement energy of said quantum well.

5. A bolometer according to claim 1, including a stack of quantum wells.

6. A bolometer according to claim 1, including conductivity measuring circuits connected to said electrodes.

7. A bolometer according to any one of claims 1 through 6, further comprising means for detecting radiation to be detected that has an angle of incidence that is close to the incidence of the normal to said input surface, said means for detecting comprising the radiation input surface which is wide, flat, and parallel to said layers.

8. A semiconductor radiation detector according to claim 7, comprising an arrangement of bolometers in the form of a linear array or of a two-dimensional array.

9. A semiconductor radiation detector according to claim 7, including a stack of several quantum wells with different characteristics.

10. A semiconductor radiation detector according to claim 9, wherein the thicknesses of said quantum-well layers are different so that the detector is sensitive to more than one wavelength.

11. A bolometer according to claim 1, wherein:
there exist only one allowed energy level in each quantum well.

12. A detector according to claim 8, wherein:
the superlattices of the array have their input surfaces in the same plane and are formed on the same substrate.

13. A bolometer according to claim 1, wherein:
said one quantum well is symmetric.

14. A quantum-well electronic bolometer for detecting radiation over a large solid angle, comprising:
a stack of semiconductor layers forming at least one quantum well having at least a first allowed energy level, and comprising a radiation input surface for receiving said radiation, wherein said input surface is parallel to said layers;
means for increasing the density of the charge carrier (electron or hole) population of the first allowed energy level;
at least two electrodes located on two opposite lateral portions of said stack of layers; and
means for generating a photocurrent across said electrodes which is continuously proportional to radiation traversing said radiation input surface.

15. A bolometer according to claim 14, wherein the largest magnitude of said photocurrent response for radiation whose angle of incidence into said radiation input surface is less than sixty degrees is not more than 150% of the smallest magnitude of photocurrent response in the same incident angle range.

* * * * *